US012176898B2

(12) United States Patent
Feng et al.

(10) Patent No.: US 12,176,898 B2
(45) Date of Patent: Dec. 24, 2024

(54) LEVEL SHIFTER CIRCUIT

(71) Applicant: Innolux Corporation, Miaoli County (TW)

(72) Inventors: Yu-Hsin Feng, Miaoli County (TW); Yu-Tse Lu, Miaoli County (TW); Fang-Zhi Chen, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/990,741

(22) Filed: Nov. 21, 2022

(65) Prior Publication Data
US 2023/0198525 A1    Jun. 22, 2023

(30) Foreign Application Priority Data
Dec. 22, 2021 (CN) .......................... 202111584831.4

(51) Int. Cl.
*H03K 19/00* (2006.01)
*H03K 19/0185* (2006.01)
*H03K 19/094* (2006.01)
*H03K 19/017* (2006.01)

(52) U.S. Cl.
CPC ........... *H03K 19/018507* (2013.01); *H03K 19/018521* (2013.01); *H03K 19/094* (2013.01); *H03K 19/017* (2013.01)

(58) Field of Classification Search
CPC ......... H03K 19/018507; H03K 19/017; H03K 19/0948; H03K 19/094; H03K 19/018521
See application file for complete search history.

(56) References Cited

U.S. PATENT DOCUMENTS

| 5,929,656 | A * | 7/1999 | Pagones ............... G09G 3/20 326/86 |
| 6,686,899 | B2 * | 2/2004 | Miyazawa ............ H03K 5/003 327/333 |
| 8,102,357 | B2 * | 1/2012 | Kajiwara ............ G09G 3/3696 326/88 |
| 8,674,744 | B2 * | 3/2014 | Smith ............ H03K 19/018521 327/108 |
| 8,736,346 | B2 * | 5/2014 | Shimizu ......... H03K 19/018521 365/189.11 |
| 2012/0001672 | A1 * | 1/2012 | Barrow ............ H03K 3/356165 327/333 |
| 2012/0038611 | A1 * | 2/2012 | Otani ............... H03K 3/356165 327/333 |
| 2016/0248426 | A1 * | 8/2016 | Pi .................. H03K 19/018507 |

(Continued)

FOREIGN PATENT DOCUMENTS

| TW | 200912879 | 3/2009 |
| TW | I407401 | 9/2013 |

OTHER PUBLICATIONS

"Office Action of Taiwan Counterpart Application", issued on Apr. 11, 2023, p. 1-p. 4.

*Primary Examiner* — Tuan T Lam
(74) *Attorney, Agent, or Firm* — JCIPRNET

(57) ABSTRACT

The disclosure provides a level shifter circuit. The level shifter circuit includes a first transistor and a second transistor. The first transistor and the second transistor generate an output voltage according to a first control signal and a second control signal, respectively. A time interval of rising edges of the output voltage is greater than a time interval of falling edges of the output voltage.

14 Claims, 6 Drawing Sheets

(56) References Cited

U.S. PATENT DOCUMENTS

| | | | |
|---|---|---|---|
| 2018/0145684 A1* | 5/2018 | Chang | H03K 3/353 |
| 2018/0151593 A1* | 5/2018 | Inoue | G09G 3/3677 |
| 2022/0173737 A1* | 6/2022 | Inoue | H03K 17/063 |

* cited by examiner

An output voltage is generated by a first transistor and a second transistor according to a first control signal and a second control signal, respectively — S100

FIG. 1C

LEVEL SHIFTER CIRCUIT

CROSS-REFERENCE TO RELATED APPLICATION

This application claims the priority benefit of China application serial no. 202111584831.4, filed on Dec. 22, 2021. The entirety of the above-mentioned patent application is hereby incorporated by reference herein and made a part of this specification.

BACKGROUND

Technical Field

The disclosure relates to a level shifter circuit.

Description of Related Art

In general, an electronic device may include a gate driving circuit coupled to scan lines of a display panel in the electronic device. The gate driving circuit receives an output voltage provided from a level shifter circuit through a signal wire on the display panel, and scan signals are output to the scan lines of the display panel. The level shifter circuit generates the output voltage based on an input voltage and provides the gate driving circuit with the output voltage. When the display panel is driven at a higher frequency, a level of the output voltage may be switched rapidly, and the rapid switching process may cause a large temperature change in a wire of area (WOA) on the display panel, which affects display quality of the display panel.

SUMMARY

The disclosure is directed to a level shifter circuit, where a time interval of rising edges of an output voltage thereof and a time interval of falling edges of the output voltage are adapted to be controlled separately, thereby reducing a temperature change of a wire of area on a display panel.

The disclosure provides a level shifter circuit including a first transistor and a second transistor. The first transistor and the second transistor are coupled in series between a first voltage and a second voltage. The first transistor and the second transistor generate an output voltage according to a first control signal and a second control signal, respectively. A time interval of rising edges of the output voltage is greater than a time interval of falling edges of the output voltage.

In an embodiment of the disclosure, the first control signal is generated according to an input voltage.

In an embodiment of the disclosure, when the first control signal falls from a second level to a first level, the output voltage rises from a third level to a fourth level.

In an embodiment of the disclosure, the level shifter circuit further includes a first signal generating circuit. The first signal generating circuit is configured to receive the input voltage and generate the first control signal according to the input voltage.

In an embodiment of the disclosure, the first signal generating circuit includes a variable resistance element. The variable resistance element is coupled between a control terminal of the first transistor and the input voltage. The variable resistance element is configured to adjust a time interval of the first control signal falling from the second level to the first level.

In an embodiment of the disclosure, the level shifter circuit further includes a first signal generating circuit. The first signal generating circuit includes a variable resistance element. The variable resistance element is coupled between a first terminal of the first transistor and the second voltage. The variable resistance element is configured to adjust a time interval of the output voltage rising from the third level to the fourth level.

In an embodiment of the disclosure, the second control signal is generated according to the input voltage.

In an embodiment of the disclosure, when the second control signal rises from the first level to the second level, the output voltage drops from a fourth level to a third level.

In an embodiment of the disclosure, the level shifter circuit further includes a second signal generating circuit. The second signal generating circuit is configured to receive the input voltage and generate the second control signal according to the input voltage.

In an embodiment of the disclosure, a time interval of falling edges of the first control signal is greater than a time interval of rising edges of the second control signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1C is an operation method of a level shifter circuit according to an embodiment of the disclosure.

DESCRIPTION OF THE EMBODIMENTS

Figure 1A:
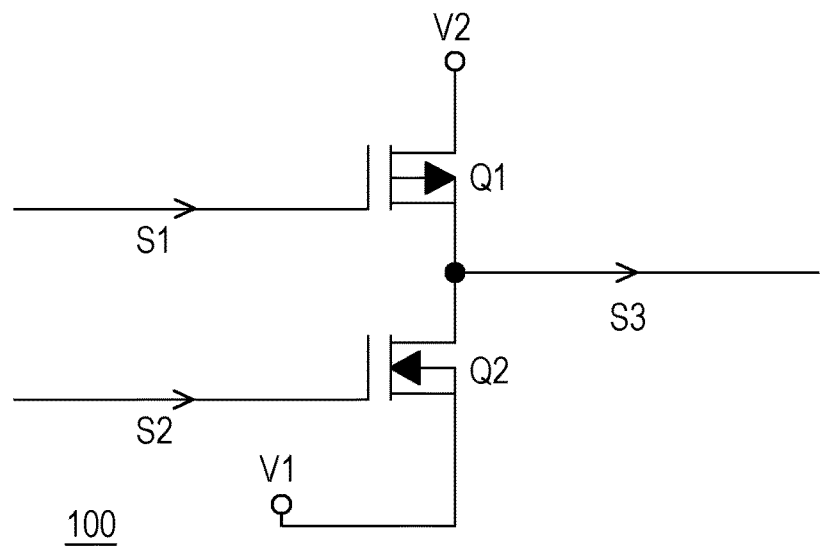
FIG. 1A is a schematic diagram of a level shifter circuit according to an embodiment of the disclosure.

The disclosure may be understood by referring to the following detailed descriptions in conjunction with the accompanying drawings. It should be noted that, in order to facilitate the reader's understanding and for the brevity of the accompanying drawings, many of the drawings in the disclosure only depict a part of an electronic device, and certain elements in the drawings are not drawn according to actual scales. In addition, the number and size of each element in the figures are for illustration only, and are not intended to limit a scope of the disclosure.

In the following description and claims, the words "comprising" and "including" are open-ended words, and thus should be interpreted as meaning "including but not limited to . . . ".

It should be understood that although the terms first, second, third . . . may be used to describe various constituent elements, the constituent elements are not limited by these terms. These terms are only used to distinguish a single constituent element from other constituent elements in the specification. In the claims, the same term may not be used, but the first, second, third are used instead according to an element declaration order in the claims. Therefore, in the following descriptions, a first constituent element may be a second constituent element in the claims.

In some embodiments of the disclosure, terms related to bonding and connecting, such as "connection", "interconnection", etc., unless otherwise defined, may mean that two structures are in direct contact, or may also mean that two structures are not in direct contact, and there are other structures located between these two structures. The terms of bonding and connecting may also include the case where both structures are movable, or both structures are fixed. Furthermore, the term "couple" includes any direct and indirect means of electrical connection.

An electronic device of the disclosure may include, but is not limited to, a display device, an antenna device, a sensing device, a lighting device, or a splicing device. The electronic device may include a bendable or flexible electronic device. The electronic device may include electronic components. The electronic device includes, for example, a liquid crystal layer or a light emitting diode (LED). The electronic components may include passive components and active components, such as capacitors, resistors, inductors, variable capacitors, filters, diodes, transistors, inductors, micro electromechanical systems (MEMS), liquid crystal chips, controllers, etc., but the disclosure is not limited thereto. The diodes may include light emitting diodes or photodiodes. The light emitting diodes may include, for example, organic light emitting diodes (OLEDs), mini LEDs, micro LEDs, quantum dot LEDs, fluorescence, phosphor or other suitable materials, or a combination of the above, but the disclosure is not limited thereto. The sensors may include, for example, capacitive sensors, optical sensors, electromagnetic sensors, fingerprint sensors (FPS), touch sensors, antennas, or styluses (pen sensors), etc., but the disclosure is not limited thereto. The controller may include, for example, a timing controller, a level shifter controller, etc. The level shifter controller includes a level shifter circuit, but the disclosure is not limited thereto. Hereinafter, a display device will be used as an electronic device to describe the disclosure, but the disclosure is not limited thereto.

Reference will now be made in detail to the exemplary embodiments of the present invention, examples of which are illustrated in the accompanying drawings. Wherever possible, the same reference numerals are used in the drawings and description to refer to the same or like parts.

Figure 1B:
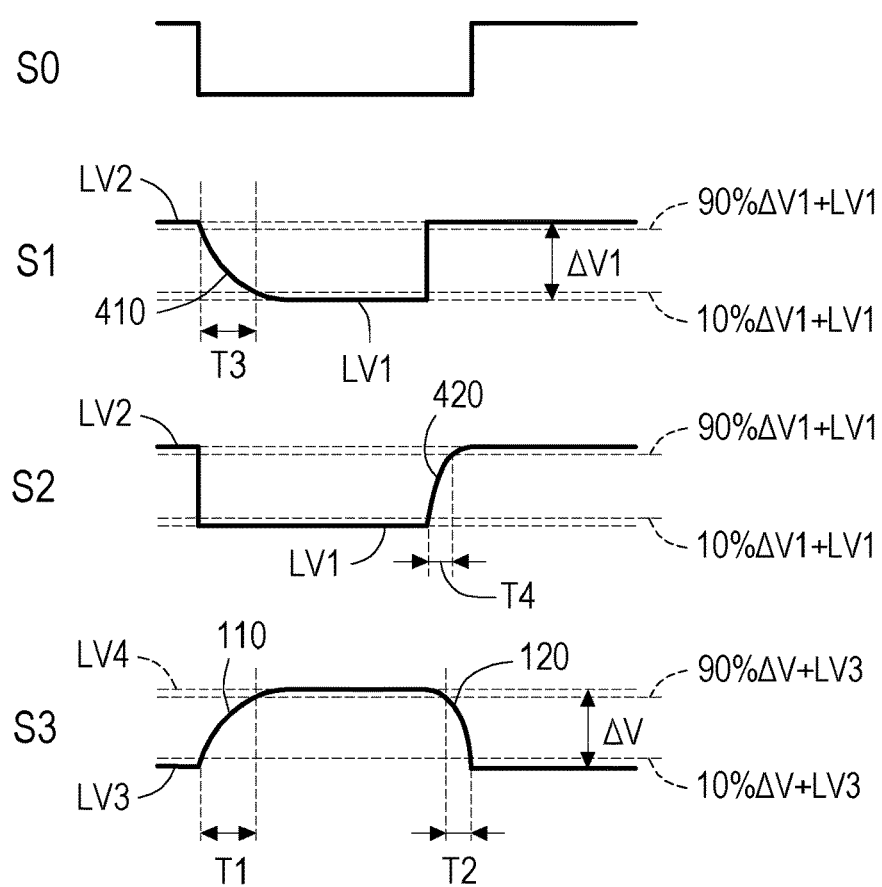
FIG. 1B is a waveform schematic diagram of various signals in the level shifter circuit of FIG. 1A.

FIG. 1A is a schematic diagram of a level shifter circuit of a display device according to an embodiment of the disclosure. FIG. 1B is a waveform schematic diagram of various signals in the level shifter circuit of FIG. 1A. Referring to FIG. 1A and FIG. 1B, a level shifter circuit 100 includes a first transistor Q1 and a second transistor Q2. The first transistor Q1 and the second transistor Q2 are coupled in series between a first voltage V1 and a second voltage V2. The first voltage V1 may be a low voltage (VGL), and the second voltage V2 may be a high voltage (VGH), but the disclosure is not limited thereto. A voltage value of the second voltage V2 is greater than a voltage value of the first voltage V1. The level shifter circuit 100 is configured to receive a first control signal S1 and a second control signal S2. Signal waveforms of the first control signal S1 and the second control signal S2 are shown in FIG. 1B. The level shifter circuit 100 may use the first control signal S1 and the second control signal S2 to generate an output voltage S3. In the embodiment, the first transistor Q1 and the second transistor Q2 respectively generate the output voltage S3 according to the first control signal S1 and the second control signal S2.

In the embodiment, a time interval T1 of rising edges 110 of the output voltage S3 is greater than a time interval T2 of falling edges 120 of the output voltage S3. For example, the output voltage S3 rises from a third level LV3 to a fourth level LV4, and a voltage difference between the third level LV3 and the fourth level LV4 is ΔV. The time interval T1 of the rising edges 110 is an interval between a time point of the output voltage S3 when the third level LV3 is added by 10% ΔV to a time point when the third level LV3 is added by 90% ΔV. The time interval T2 of the falling edges 120 is an interval between a time point of the output voltage S3 when the third level LV3 is added by 90% ΔV to a time point when the third level LV3 is added by 10% ΔV. The fourth level LV4 is substantially equal to a level of the second voltage V2, and the third level LV3 is substantially equal to a level of the first voltage V1. In an embodiment, the fourth level LV4 is positive 20 volts (V), and the third level LV3 is negative 10 volts, but the disclosure is not limited thereto.

In the embodiment, the first transistor Q1 is configured to receive the first control signal S1, and the second transistor Q2 is configured to receive the second control signal S2. Specifically, the first transistor Q1 includes a first terminal, a second terminal and a control terminal, and the second transistor Q2 includes a first terminal, a second terminal and a control terminal. The first terminal of the first transistor Q1 is coupled to the second voltage V2, the second terminal of the first transistor Q1 is coupled to the first terminal of the second transistor Q2, and the control terminal of the first transistor Q1 is coupled to the first control signal S1. The first terminal of the second transistor Q2 is coupled to the second terminal of the first transistor Q1, the second terminal of the second transistor Q2 is coupled to the first voltage V1, and the control terminal of the second transistor Q2 is coupled to the second control signal S2. The second terminal of the first transistor Q1 or the first terminal of the second transistor Q2 is used as an output terminal to output the output voltage S3. In an embodiment, the first transistor Q1 is a P-type metal oxide semiconductor (PMOS) transistor, and the second transistor Q2 is an N-type metal oxide semiconductor (NMOS) transistor, but the disclosure is not limited thereto.

In an embodiment, the output voltage S3 of the level shifter circuit 100 may be provided to a gate driving circuit on the display panel. The gate driving circuit receives the output voltage S3 provided by the level shifter circuit 100 through a signal wire on the display panel, and drives scan lines of the display panel accordingly.

In addition, in the disclosure, an operation method of the level shifter circuit 100 includes: making the first transistor Q1 and the second transistor Q2 to generate the output voltage S3 respectively according to the first control signal S1 and the second control signal S2, as shown in step S100 in FIG. 1C. The time interval of the rising edges of the output voltage S3 is greater than the time interval of the falling edges of the output voltage S3.

Figure 2A:
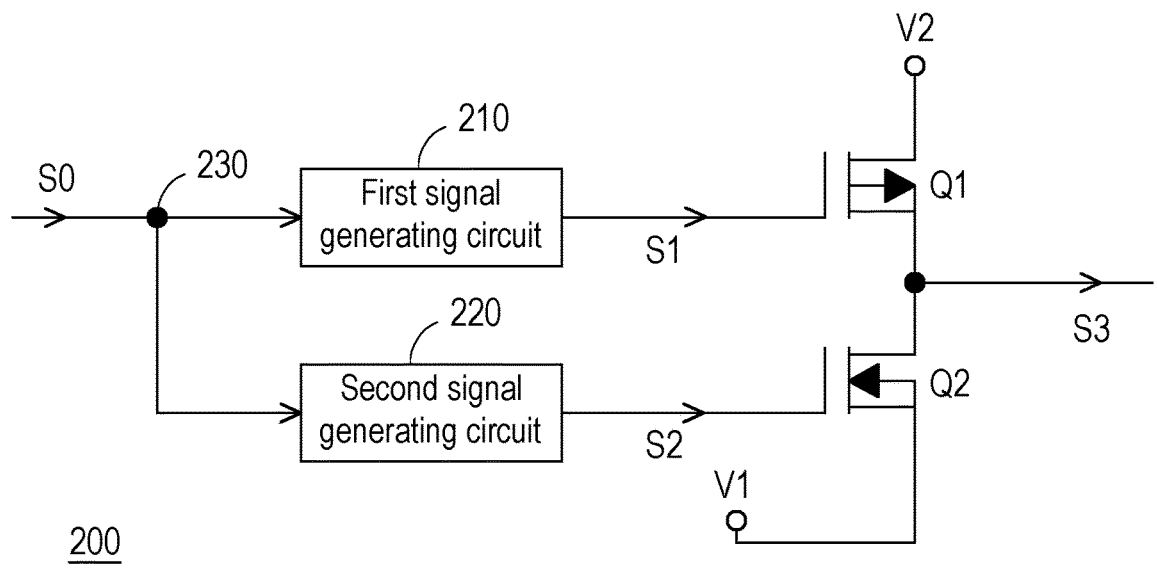
FIG. 2A is a schematic diagram of a level shifter circuit according to another embodiment of the disclosure.

FIG. 2A is a schematic diagram of a level shifter circuit according to another embodiment of the disclosure. Referring to FIG. 2A and FIG. 1B, a level shifter circuit 200 may generate the output voltage S3 according to an input voltage S0. A main difference between the level shifter circuit 200 of FIG. 2A and the level shifter circuit 100 of FIG. 1A is that, for example, the level shifter circuit 200 further includes a first signal generating circuit 210 and a second signal generating circuit 220, and the first signal generating circuit 210 and the second signal generating circuit 220 receive the input voltage S0 to generate the first control signal S1 and the second control signal S2. The first signal generating circuit 210 is coupled between an input terminal 230 of the level shifter circuit 200 and the control terminal of the first transistor Q1. The second signal generating circuit 220 is coupled between the input terminal 230 of the level shifter circuit 200 and the control terminal of the second transistor Q2.

The first signal generating circuit 210 is configured to receive the input voltage S0 from the input terminal 230 and generate the first control signal S1 according to the input voltage S0. Therefore, the first transistor Q1 receives the first control signal S1, and the first control signal S1 is generated according to the input voltage S0. As shown in FIG. 1B, when the first control signal S1 drops from the second level LV2 to the first level LV1, the output voltage S3 rises from the third level LV3 to the fourth level LV4. The second level LV2 is greater than the first level LV1 and the third level LV3. The fourth level LV4 is greater than the first level LV1 and the third level LV3. The first level LV1 may or may not be equal to the third level LV3. The second level LV2 may or may not be equal to the fourth level LV4. A voltage difference between the first level LV1 and the second level LV2 is ΔV1. A time interval T3 of a falling edge 410 is an interval between a time point of the first control signal S1 when the first level LV1 is added by 90% ΔV1 to a time point when the first level LV1 is added by 10% ΔV1.

The second signal generating circuit 220 is configured to receive the input voltage S0 from the input terminal 230 and generate the second control signal S2 according to the input voltage S0. Therefore, the second transistor Q2 receives the second control signal S2, and the second control signal S2 is generated according to the input voltage S0. As shown in FIG. 1B, when the second control signal S2 rises from the first level LV1 to the second level LV2, the output voltage S3 drops from the fourth level LV4 to the third level LV3. A time interval T4 of rising edges 420 is an interval between a time point of the second control signal S1 when the first level LV1 is added by 10% ΔV1 to a time point when the first level LV1 is added by 90% ΔV1. In the embodiment, the time interval T3 of the falling edges 410 of the first control signal S1 may be greater than the time interval T4 of the rising edges 420 of the second control signal S2. In some embodiments, the time interval T3 and the time interval T4 may adopt the same calculation method as the time interval T1 and the time interval T2, which will not be repeated here.

Figure 2B:
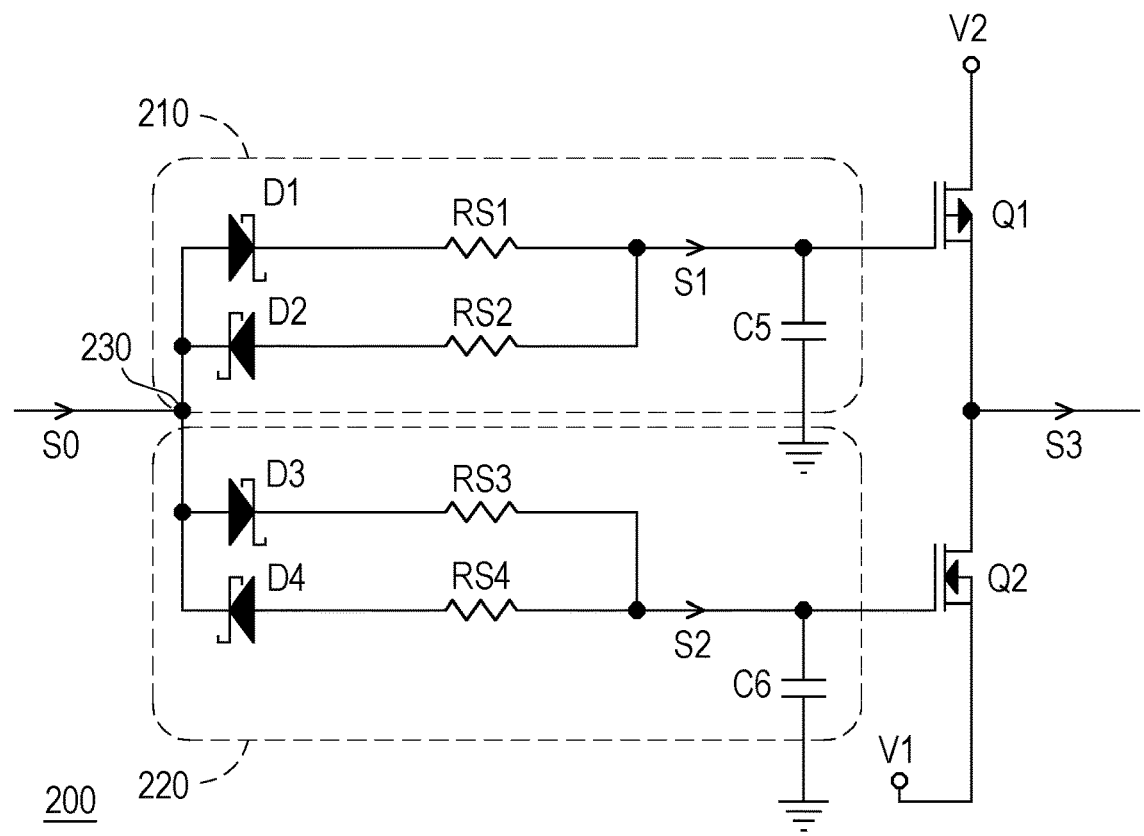
FIG. 2B is a schematic structural diagram of a first signal generating circuit and a second signal generating circuit of the embodiment of FIG. 2A.

FIG. 2B is a schematic structural diagram of the first signal generating circuit and the second signal generating circuit of the embodiment of FIG. 2A. Referring to FIG. 2B, the first signal generating circuit 210 includes a Schottky diode D1, a Schottky diode D2, a resistor RS1, a resistor RS2 and a capacitor C5, and a connection relationship thereof is shown in FIG. 2B, but the disclosure is not limited thereto. The second signal generating circuit 220 includes a Schottky diode D3, a Schottky diode D4, a resistor RS3, a resistor RS4 and a capacitor C6, and a connection relationship thereof is shown in FIG. 2B, but the disclosure is not limited thereto. In the embodiment, capacitance values of the capacitors C5 and C6 may be designed to be equal, resistance values of the resistor RS1, the resistor RS3, and the resistor RS4 may be designed to be equal, and a resistance value of the resistor RS2 may be designed to be larger than the resistance values of the resistor RS1, the resistor RS3 and the resistor RS4, such that the time interval T3 of the falling edges 410 of the first control signal S1 is greater than the time interval T4 of the rising edges 420 of the second control signal S2. Since the time interval T3 of the falling edges 410 of the first control signal S1 may be adjusted according to a resistance value of the resistor RS2, the time interval of the rising edges of the output voltage S3 and the time interval of the falling edges of the output voltage S3 may be controlled separately, thereby reducing a temperature change of a wire of area on the display panel.

Figure 3:
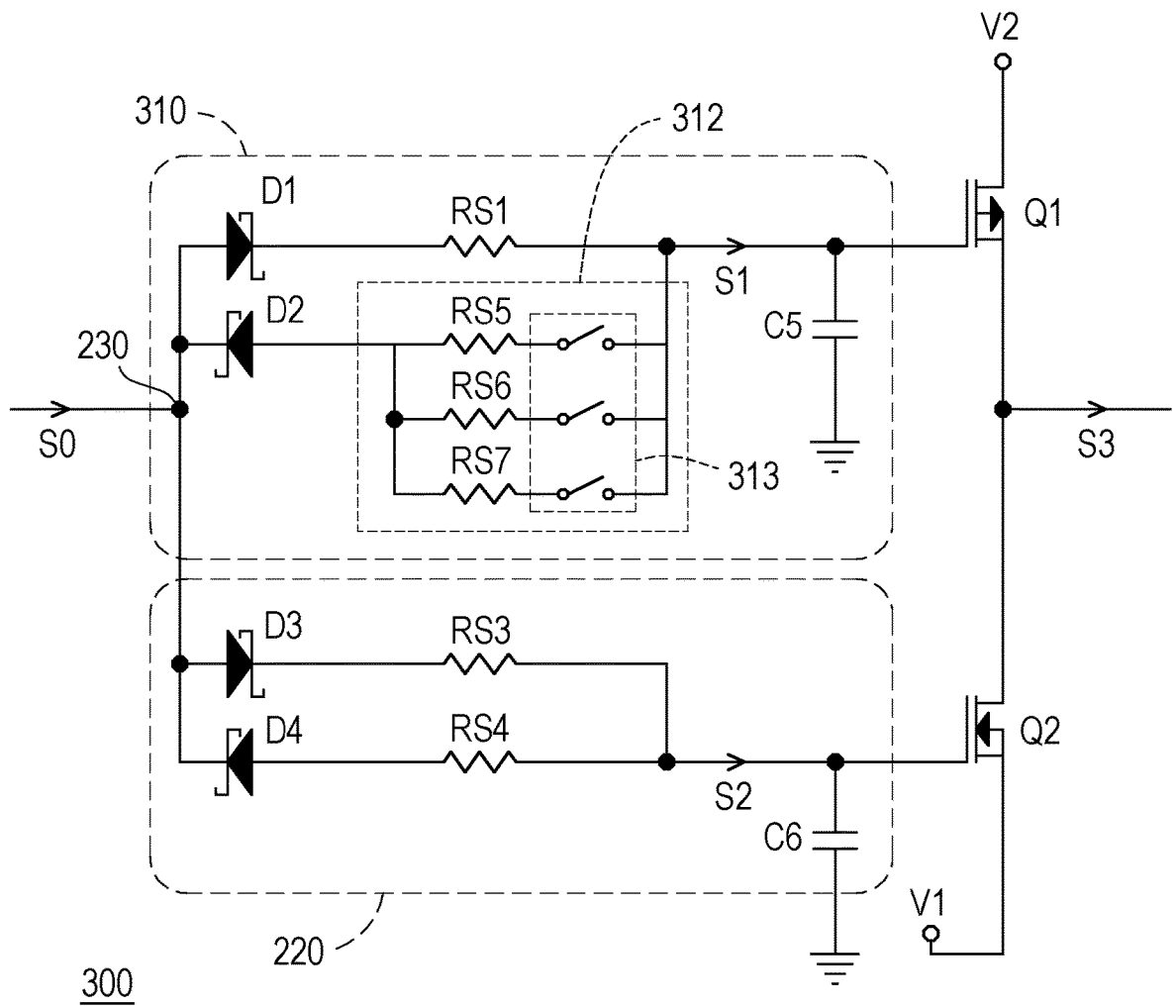
FIG. 3 is a schematic structural diagram of a first signal generating circuit according to another embodiment of the disclosure.

FIG. 3 is a schematic structural diagram of a first signal generating circuit according to another embodiment of the disclosure. Referring to FIG. 3, a main difference between the present embodiment and the embodiment disclosed in FIG. 2A and FIG. 2B is that a first signal generating circuit 310 includes a variable resistance element 312. Referring to FIG. 1B synchronously, the variable resistance element 312 is coupled between the control terminal of the first transistor Q1 and the input terminal 230 for adjusting the time interval T3 during which the first control signal S1 drops from the second level LV2 to the first level LV1. The variable resistance element 312 includes a switch element 313 and a resistor RS5, a resistor RS6, and a resistor RS7 coupled thereto. The resistor RS5, the resistor RS6, and the resistor RS7 may be respectively connected to the switch element 313 in series, but the disclosure is not limited thereto. By adjusting a conduction state of each switch in the switch element 313, a resistance value of the variable resistance element 312 may be adjusted, thereby adjusting the time interval T3 of the falling edges 410 of the first control signal S1. Since the time interval T3 of the falling edges 410 of the first control signal S1 may be adjusted according to the resistance value of the variable resistance element 312, the time interval of the rising edges of the output voltage S3 and the time interval of the falling edges of the output voltage S3 may be controlled separately to reduce the temperature change of the wire of area on the display panel.

Figure 4:
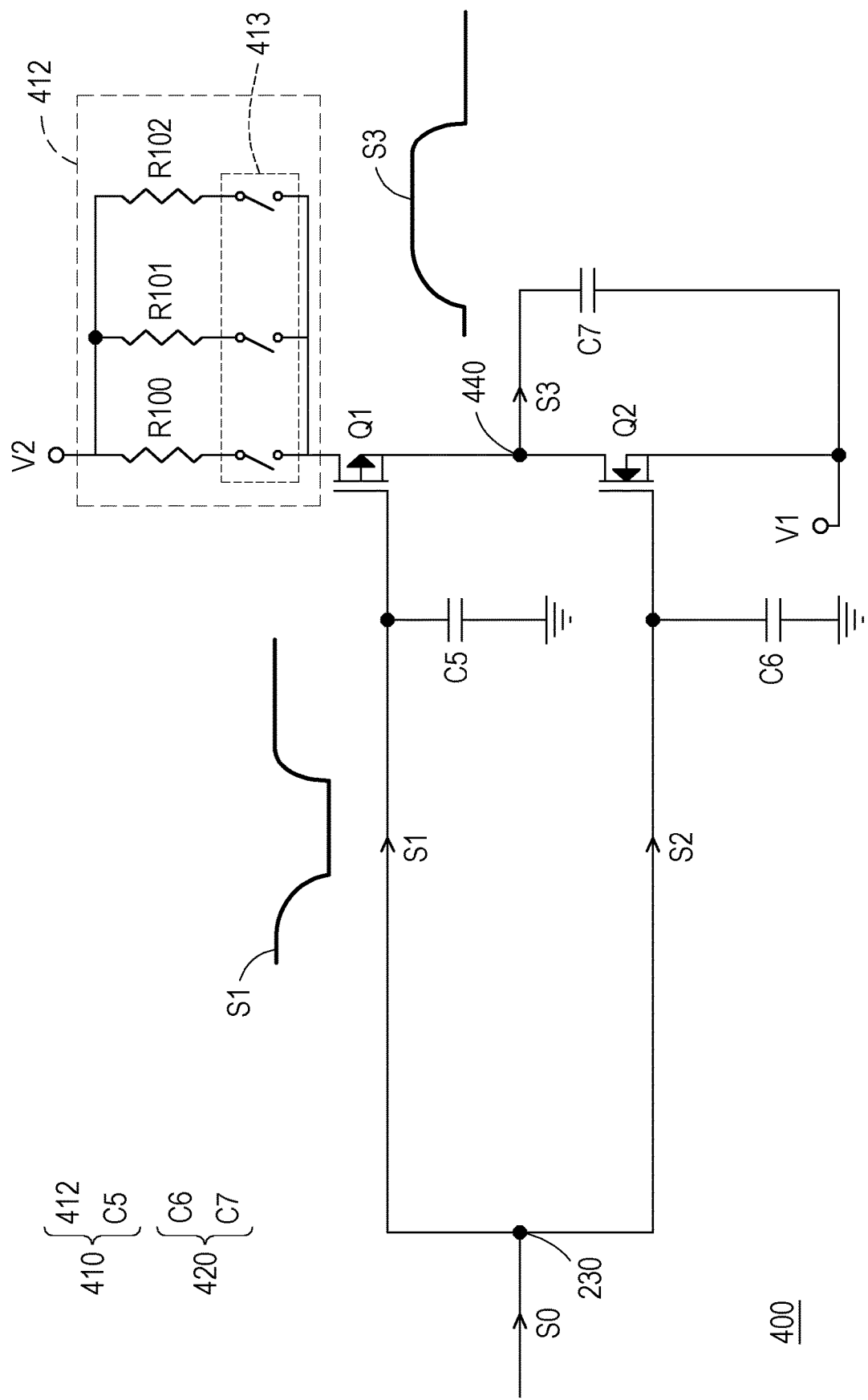
FIG. 4 is a schematic diagram of a level shifter circuit according to another embodiment of the disclosure.

FIG. 4 is a schematic diagram of a level shifter circuit according to another embodiment of the disclosure. Referring to FIG. 4, a level shifter circuit 400 generates the output voltage S3 according to the input voltage S0. The level shifter circuit 400 further includes a first signal generating circuit 410 and a second signal generating circuit 420. The first signal generating circuit 410 includes a variable resistance element 412 and a capacitor C5, but the disclosure is not limited thereto. The second signal generating circuit 420 includes a capacitor C6, and a capacitor C7, but the disclosure is not limited thereto.

The variable resistance element 412 is coupled between the first terminal of the first transistor Q1 and the second voltage V2, and may adjust the time interval T1 during which the output voltage S3 rises from the third level LV3 to the fourth level LV4. The variable resistance element 412 includes a switch element 413 and a resistor R100, a resistor R101, and a resistor R102 coupled thereto, but the disclosure is not limited thereto. By adjusting a conduction state of each switch in the switching element 413, a resistance value of the variable resistance element 413 may be adjusted, thereby adjusting the time interval T1 of the rising edges 110 of the output voltage S3.

Figure 5:
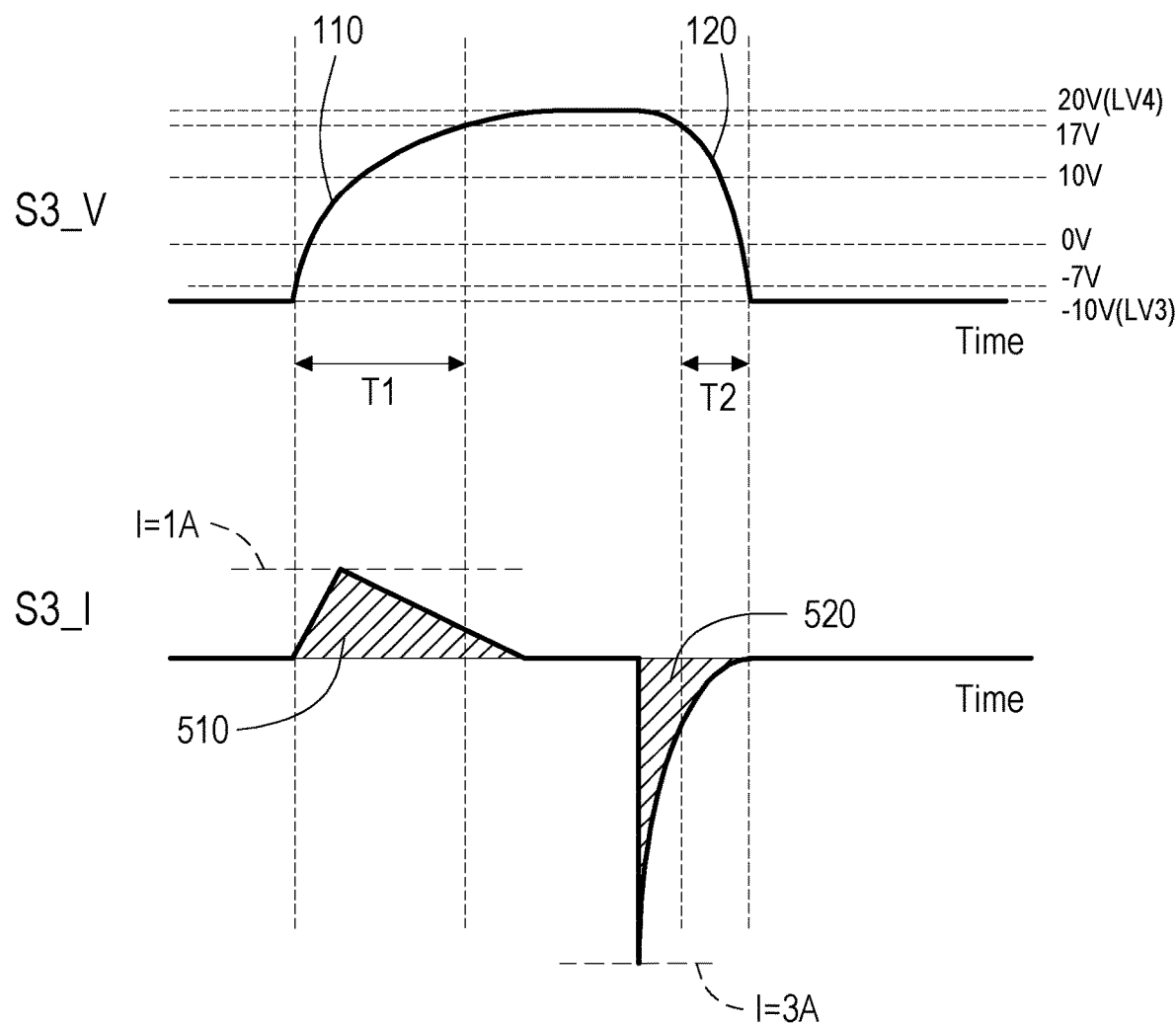
FIG. 5 is a schematic diagram illustrating voltage and current waveforms of an output signal according to an embodiment of the disclosure.

FIG. 5 is a schematic diagram illustrating voltage and current waveforms of an output signal according to an embodiment of the disclosure. Referring to FIG. 5, in the embodiment, the time interval T1 of the rising edges 110 of an output voltage S3_V is greater than the time interval T2 of the falling edges 120 of the output voltage S3_V. In the time interval T1, an area enclosed by an output current S3_I and a time axis is marked as 510, and the maximum value of the output current S3_I is 1 ampere. In the time interval T2, an area enclosed by the output current S3_I and the time axis is marked as 520, and the maximum value of the output current S3_I is 3 amperes. During the time interval T1, since the maximum value and a change rate of the output current S3_I are smaller, the temperature change of the wire of area on the display panel may be reduced.

In summary, in the embodiment of the disclosure, the level shifter circuit is used to generate the output voltage according to the input voltage, and the time interval of the rising edges and the time interval of the falling edges may be controlled separately, thereby reducing the temperature change of the wire of area on the display panel.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A level shifter circuit, comprising:
   a first transistor and a second transistor, coupled in series between a first voltage and a second voltage, wherein the first transistor and the second transistor generate an output voltage according to a first control signal and a second control signal, respectively,
   wherein a time interval of rising edges of the output voltage is greater than a time interval of falling edges of the output voltage; and
   a first signal generating circuit, wherein the first signal generating circuit comprises a variable resistance element, the variable resistance element is coupled between a control terminal of the first transistor and an input voltage, and configured to adjust a time interval of the first control signal dropping from a second level to a first level, wherein a time interval of falling edges of the first control signal is greater than a time interval of rising edges of the second control signal.

2. The level shifter circuit as claimed in claim 1, wherein the first control signal is generated according to the input voltage.

3. The level shifter circuit as claimed in claim 1, wherein when the first control signal drops from the second level to the first level, the output voltage rises from a third level to a fourth level.

4. The level shifter circuit as claimed in claim 1, wherein the first signal generating circuit is configured to receive the input voltage and generate the first control signal according to the input voltage.

5. The level shifter circuit as claimed in claim 1, wherein the second control signal is generated according to the input voltage.

6. The level shifter circuit as claimed in claim 5, wherein when the second control signal rises from the first level to the second level, the output voltage drops from a fourth level to a third level.

7. The level shifter circuit as claimed in claim 6, further comprising a second signal generating circuit configured to receive the input voltage and generate the second control signal according to the input voltage.

8. An operation method of a level shifter circuit, wherein the level shifter circuit comprises a first transistor, a second transistor coupled in series between a first voltage and a second voltage, and a variable resistance element coupled between a control terminal of the first transistor and an input voltage, and the operation method of the level shifter circuit comprising:
   generating an output voltage through the first transistor and the second transistor according to a first control signal and a second control signal, respectively, wherein a time interval of rising edges of the output voltage is greater than a time interval of falling edges of the output voltage; and
   adjusting a time interval of the first control signal dropping from a second level to a first level through the variable resistance element, wherein a time interval of falling edges of the first control signal is greater than a time interval of rising edges of the second control signal.

9. The operation method of the level shifter circuit as claimed in claim 8, wherein the first control signal is generated according to the input voltage.

10. The operation method of the level shifter circuit as claimed in claim 8, wherein when the first control signal drops from the second level to the first level, the output voltage rises from a third level to a fourth level.

11. The operation method of the level shifter circuit as claimed in claim 10, further comprising:
    generating the first control signal according to the input voltage.

12. The operation method of the level shifter circuit as claimed in claim 8, wherein the second control signal is generated according to the input voltage.

13. The operation method of the level shifter circuit as claimed in claim 12, wherein when the second control signal rises from the first level to the second level, the output voltage drops from a fourth level to a third level.

14. The operation method of the level shifter circuit as claimed in claim 13, further comprising:
    generating the second control signal according to the input voltage.

* * * * *